United States Patent [19]

Nakamura et al.

[11] Patent Number: 4,568,879

[45] Date of Patent: Feb. 4, 1986

[54] MARKING APPARATUS

[75] Inventors: Seiichi Nakamura; Isao Nishigaya, both of Tokyo, Japan

[73] Assignee: Nippon Electric Co., Ltd., Tokyo, Japan

[21] Appl. No.: 369,979

[22] Filed: Apr. 19, 1982

[30] Foreign Application Priority Data

Apr. 22, 1981 [JP] Japan ............................ 56-58182[U]

[51] Int. Cl.⁴ ........................ G01R 1/06; G01R 31/02
[52] U.S. Cl. ................................ 324/158 P; 324/72.5; 324/158 F
[58] Field of Search ............... 324/158 F, 158 P, 72.5; 33/18 R

[56] References Cited

U.S. PATENT DOCUMENTS 3,345,567 10/1967 Turner et al. .................... 324/158 P
3,437,929 4/1969 Glenn ............................. 324/158 F
3,641,972 2/1972 Hostetter ........................ 324/158 P Primary Examiner—Ernest F. Karlsen
Attorney, Agent, or Firm—Laff, Whitesel, Conte & Saret

[57] ABSTRACT

A marking apparatus has an arm with a seat section for enabling the arm to be mounted on a support plate, in the proximity at one of its ends. A main body of an actuating section is fixedly secured to one surface of the arm in the proximity of its other end. The main body of the actuating section has a function of placing a "defective mark" on a defective semiconductor chip, in response to a signal applied thereto.

6 Claims, 6 Drawing Figures

MARKING APPARATUS

BACKGROUND OF THE INVENTION

The present invention relates to a marking apparatus for applying a "defective mark" to identify a defective chip, within a semiconductor wafer.

A semiconductor wafer has a plurality of semiconductor chips formed therein through the use of photolithographic and impurity diffusion processes. The wafer is tested with respect to the respective individual semiconductor chips by means of a test system which marks the defective chips. Thereafter, the wafer is cut into the separate chips.

The test system generally comprises one tester, a plurality of probers connected to this tester, and probe cards which are to be inserted into the respective probers. The includes a tester main body and a plurality of stations, each of which forms a part of the tester. One of the stations is provided for each prober. The prober includes a table for loading semiconductor wafer a marking apparatus and a prober controller.

At present, efforts are made to seek a speed-up of an operation speed of semiconductor integrated circuit devices, whose integration are more and more increased. In view of such current status of the art, a speed-up of testing and marking in a test system for semiconductor wafers has been also required.

In a test system in the prior art, however, the configuration of the marking apparatus used therein was a hindrance against a speed-up of an operation of the test system.

SUMMARY OF THE INVENTION

One object of the present invention is to provide an effective marking apparatus which contributes to a high-speed operation of a wafer testing system.

According to one feature of the present invention, a marking apparatus comprises an arm having seat sections for enabling a mounting of the arm onto the support plate in the vicinity of its opposite ends. A main body of an actuating section is fixedly secured to one surface of the arm at its central portion, as suspended from the arm. The main body of the actuating section has the function of marking a "defective mark" on a defective semiconductor chip, in response to a signal applied thereto.

According to another feature of the present invention, a marking apparatus comprising an arm having a seat section for enabling a mounting of the arm onto a support plate in the proximity of its one end. A main body of an actuating section is fixedly secured to one surface of the arm and in the proximity of the other and supporting end thereof. The main body of the actuating section has the function of marking a "defective mark" on a defective semiconductor chip, in response to a signal applied thereto.

According to further feature of the present invention, a semiconductor wafer defective marking apparatus applies a "defective mark" to a defective chip within a semiconductor wafer. The apparatus has an arm mounted on an upper surface of a support plate in an adjustably movable manner and is extended above a measurement gap space where a probe card is disposed. A main body of an actuating section of the semiconductor wafer defective marking device is provided on the lower surface of the arm so that the main body of the actuating section may be fitted in the gap space.

In such a marking apparatus, the seat section favorably has en elongated hole, to allow the arm to be adjustably mounted on the upper surface of the support plate. Also, the main body of the actuating section favorably has a marking-off needle for scratching the surface of a defective semiconductor chip.

According to another aspect of the invention, a prober comprises a support plate having a measurement gap space. A table for supporting a semiconductor wafer is positioned under the measurement gap space. A marking apparatus makes a defective mark on a defective semiconductor chip. The marking device including an arm mounted on a support plate and extending over the measurement gap space. A main body of an actuating section is mounted onto the lower surface of the arm and positioned within the measurement gap space in order to make a defective mark on a defective semiconductor chip in response to a signal applied thereto.

DESCRIPTION OF PREFERRED EMBODIMENTS

Figure 1:
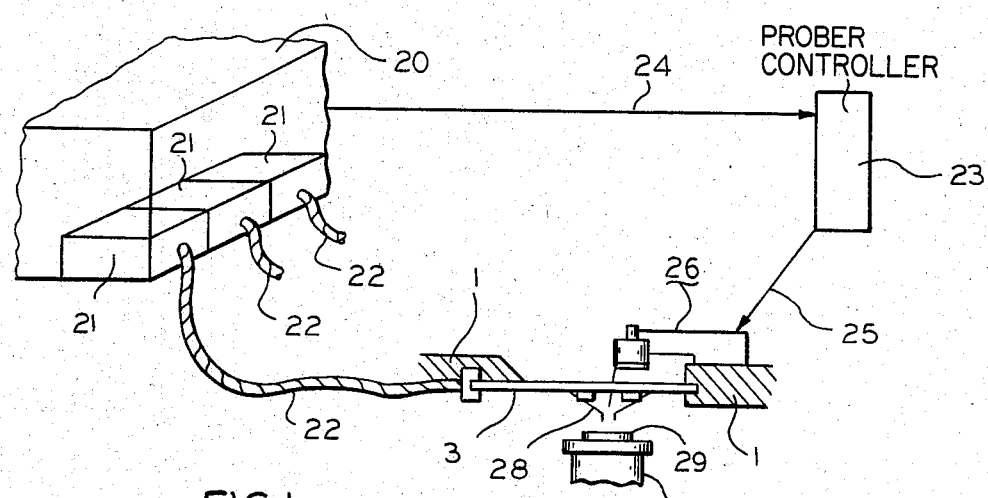
FIG. 1 is a schematic view showing a test system making use of a marking apparatus in the prior art.
Figure 2:
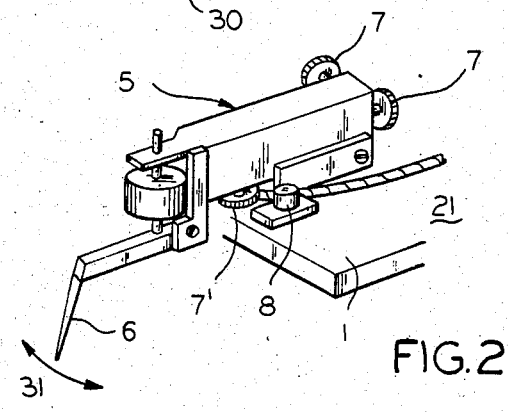
FIG. 2 is a perspective view showing a marking apparatus in the prior art.

One example of a prior art test system is schematically illustrated in FIG. 1. A main body 20 has a plurality of stations 21, each of which forms a part of the tester. The respective stations are connected to corresponding probers through long measurement cables 22, of about 1 m in length. On the other hand, each prober is composed of a prober controller 23, a marking apparatus 26 disposed on a support plate 1 and a wafer supporting table 30 for loading a semiconductor wafer 29 thereon in a position which is opposed to a plurality of probes 28 on a probe card 3. This prior art marking apparatus 26 is illustrated in greater detail in FIG. 2. A main body 5 of the marking apparatus is fixedly secured onto one of the support plates 1 by means of screws 8. A position of a making-off needle 6 is adjusted by means of position adjusters 7 and 7'. A mark or scratch is marked on a defective chip by actuating the stylus or marking-off needle 6 along the path represented by arrows 31.

In this prior art test system, each station and the corresponding probe card 3 (FIG. 1) are connected to each other through a long measurement cable 22, about 1 m in length. Accordingly, measurement of one semiconductor chip within the semiconductor wafer 29 is effected in the station 21, via the measurement cable and the probes 28.

Subsequently, the wafer supporting table 30 is moved in the lateral, longitudinal and vertical directions to bring the next semiconductor chip into contact with the probes 28, and then measurement of the next chip is effected. If the measurement indicates that the semiconductor chip is defective, a signal is transmitted from the tester 20 through a cable 24 to the prober controller 23, which drives the marking apparatus 26 by sending a driving signal via a cable 25. The marking apparatus 26 is actuated to mark or scratch the surface of the defective chip with the stylus or marking-off needle 6.

In this prior art test system, the station 21, forming a part of the tester 20, is connected through a long measurement cable 22 to the probe card 3. Upon measurement, the device cannot operate at a high speed, owing to the inter-line capacitances of the cable. In order to obviate this shortcoming, the station 21 must be positioned above the probe card 3 and be directly connected to the probe card 3, without employing a measurement cable. However, the marking apparatus 26 in the prior art has a structure protruding above the support plate, as will be apparent from FIG. 1. Therefore it is impossible to position the station 21 just above the probe and the probe card 3, as long as the prior art marking apparatus 26 is used.

Figure 3:
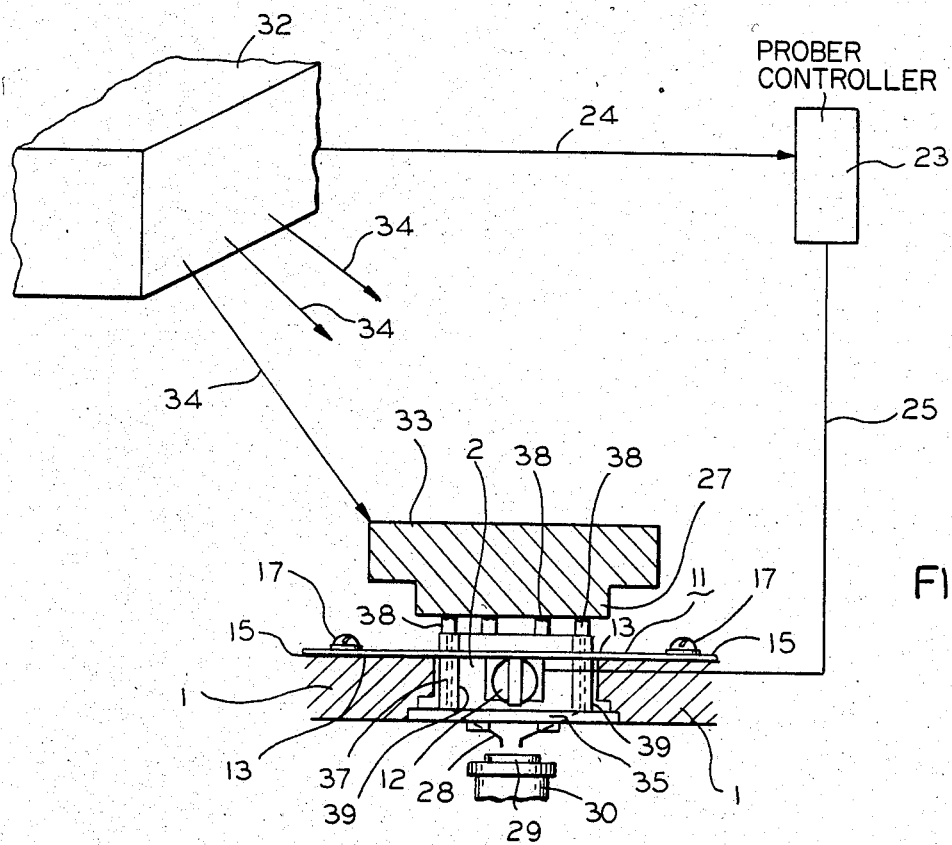
FIG. 3 is a schematic view showing a test system making use of a marking apparatus according to one preferred embodiment of the present invention.

An outline of a test system making use of a marking apparatus according to one preferred embodiment of the present invention is illustrated in FIG. 3. It is to be noted that component parts in FIG. 3, having the same functions as those shown in FIG. 1, are denoted by like reference numerals.

In this test system, each station 33 is separated from a tester main body 31 and positioned directly above a probe card 35, so that the probe card 35 and station 33 can be directly connected to each other, without using a measurement cable, and thereby enable a high speed operation, in measurement.

Figure 4:
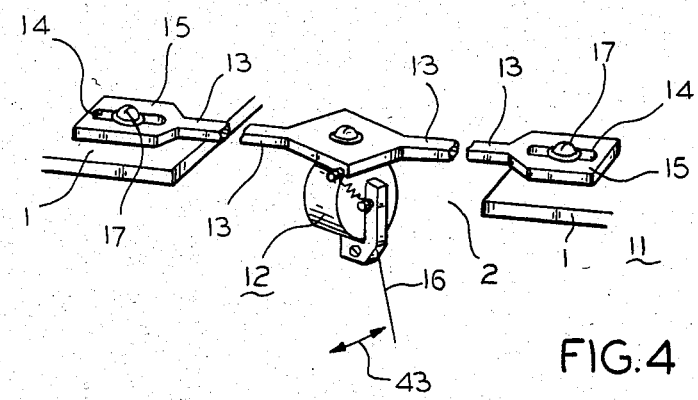
FIG. 4 is a perspective view showing the marking apparatus according to the preferred embodiment of the present invention illustrated in FIG. 3.

More particularly, as shown in FIGS. 3 and 4, the marking apparatus 11 according to the present invention includes an arm 13 fixedly secured to upper surface of a support plate 1 by means of seat sections 15. An actuating main body 12 is fixedly mounted at the center of the arm 13 and positioned in a gap space 2 in the support plate 1. The seat sections 15 are provided in the proximity of the opposite ends of the arm 13, and elongated holes 14 are formed therein. Set screws 17 engage these elongated holes 14 to adjustably fix the arm 13 to the support plate 1. In this connection, the width of the elongated hole 14 is larger than the diameter of the set screw 17, with some margin left therebetween, so that the arm 13 can be adjustably moved with respect to the set screws 17, to be fixed at a desired position where it is fastened by the set screws 17. The actuating main body 12 has a stylus or marking-off needle 16 secured to the center of lower surface of the arm 13 by means of a screw. Body 12 is placed within a measurement gap space 2 in the support plate 1, which gap is about 10 cm in width. Body 12 is suspended from the arm 13 so that the stylus or marking-off needle 16 may be located at a position opposed to the semiconductor wafer 29, on the wafer support table 30.

The electrical coupling (FIG. 3) between the probe card 35 and the station 33 includes a cylindrical insulator member 39 placed on the card 35. Conductors 37 electrically connects the respective probes 28 to the station 33, in the vertical direction, through the insulator member 39. The top ends of the conductors 37 are connected to contact pins 38 which are fixedly disposed on the upper end of the insulator 39. The insulator member 39 and the contact pins 38 extend up to a level which is just above the arm 13, and hence, as a matter of course, they are provided at positions which are deviated from the position of the arm 13. Therefore, the contact pins 38 can be directly connected to the respective terminals (not shown) provided on the bottom surface of a protrusion 27 of the station 33.

As described above, according to the present invention, only a small protrusion due to the arm 13 is formed on the upper surface of the support plate. Therefore, the station 33 forming a part of the tester can be disposed just above the gap space 2, without being hindered by the marking apparatus 11. In the event that the upper surfaces of the seat sections 15 of the arm 13 are covered by the station 33, it is only necessary to mount the seat sections 15 onto the support plate 1 by means of a further elongated arm 13.

In the illustrated embodiment, the tester main body 32 is connected to the respective stations 33 through cables 34. However, this cable does not bring about any hindrance in the measurement of the high-speed operation. In more particular, as described previously the station 33 is a part of the tester and has the functions of applying voltages and/or currents to the semiconductor chip and of measuring the voltages and/or currents. The aforementioned functions are achieved for each semiconductor chip, directly from the station 33.

Accordingly, it is important for realizing high-speed device operations to connect the station to the semiconductor chip via the probes 28, without employing a measurement cable. Whereas, the connection between the tester main body 32 and the station 33 is an internal circuit of the tester. The cable 34 is a connection for controlling the station 33 from the tester main body 32 and is not a connection for either directly applying voltages and/or currents to the semiconductor wafer 29 or measuring the voltages and/or currents. Therefore, the presence of the cable 34 does not influence the measurement condition.

Now a description will be made on the operation of the illustrated test system. The station 33 is controlled by the tester main body 32 via the cable 34. The operation characteristics of each semiconductor chip is measured in a manner which is similar to the test system shown in FIG. 1. If a defective semiconductor chip is detected as a result of the measurement, a signal is transmitted from the tester main body 32 to a prober controller 23 via a cable 24. Further a signal is transmitted from the prober controller 23 to an actuating main body 12 of the marking apparatus 11 via another cable 25. It is to be noted that the prober controller 23 and the cable 25 could be assembled together with other means within a prober casing.

Figure 5:
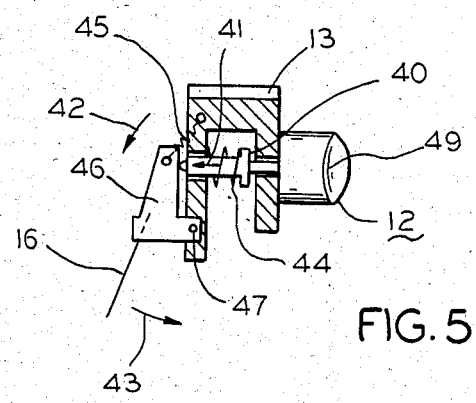
FIG. 5 is a schematic view showing a main body of an actuating section in the marking apparatus according to the present invention.

An actuating main body 12 of the marking apparatus 11 is illustrated in more detail in FIG. 5. In response to a signal indicating that the measured semiconductor chip has defective electrical characteristics, a solenoid 49 operates and a shaft 40 associated with a spring 44 is moved in the direction of an arrow 41. Accordingly, a lever 46, associated with a spring 45, swings about a pivot 47 in the direction of an arrow 42. Hence, a stylus or marking-off needle 16 moves in the direction of an arrow 43, and the defective smiconductor chip is scratched, or otherwise marked to effect "defective marking".

Figure 6:
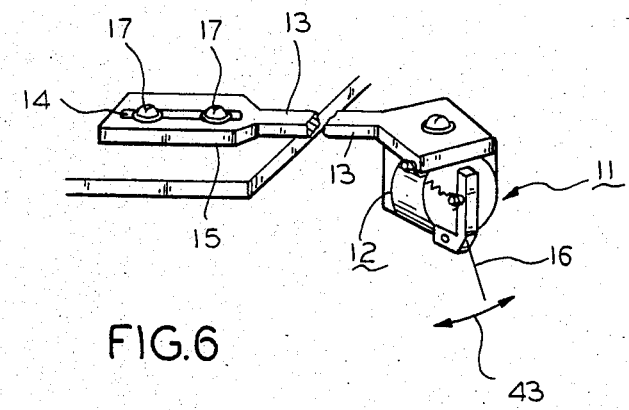
FIG. 6 is a perspective view showing a marking apparatus according to another preferred embodiment of the present invention.

FIG. 6 is a perspective view showing a marking apparatus according to another preferred embodiment of the present invention. It is to be noted that in FIG. 6 component parts having the same functions as those shown in FIG. 4 are given like reference numerals. That is, while the first preferred embodiment was described above with reference to FIG. 4 in connection to the case where the opposite end portions of the arm were fixedly mounted on the support plates, a cantilever type support could also be employed, as shown in FIG. 6. What is important is that an actuating main body of a marking apparatus is disposed on the lower surface of the arm extended from the support plate or plates towards the measurement gap space, and it is fitted into the measurement gap space.

In the present embodiments, the actuating main body of the semiconductor wafer marking apparatus can be accommodated within a gap space of a measurement section. The position of the actuating main body can be adjusted externally of the measurement section. Accordingly, the mounting, adjustment and maintenance of the marking apparatus can be achieved easily. The present invention is effective for realizing a speed-up of the measurement work.

While an actuating main body of a marking apparatus of the type that a defective semiconductor chip is scratched has been described in connection to the above embodiments, it is to be noted that the present invention is equally applicable to a marking apparatus of the type that a defective semiconductor chip is marked by a drop of ink or by other marks.

What is claimed is:

1. A prober comprising a support plate having a measurement gap space and having a flat upper surface, a table for loading a semiconductor wafer, said table being positioned under said measurement gap space, first means for applying electric power for testing semiconductor chips in said semiconductor wafer, second means located above said measurement gap space for supplying said electric power to said first means, marking apparatus for marking a defective semiconductor chip in said semiconductor wafer, said marking apparatus including an arm having a flat bottom surface fixed onto said flat upper surface of said support plate at a first portion of said flat bottom surface and extending over said measurement gap space, an actuator suspended from a second portion of said flat bottom surface of said arm and positioned within said measurement gap space above said semiconductor wafer and at a level which is lower than the level of said arm, and a marker for applying a mark to said defective semiconductor chip, said marker being coupled to and actuated by said actuator, said marker being positioned within said measurement gap space and located at a level lower than the level of said arm, said first means including a probe card positioned between said actuator of said marking apparatus and said table for loading said semiconductor wafer and having a plurality of probes adapted to contact with electrodes of said semiconductor chips, said first means further including conductor members electrically contacted with said respective probes of said probe card, each of said conductor members being extended in the vertical direction from the contacted portion with said probe to a level which is above said arm and coupled to said second means.

2. The prober of claim 1, in which said actuator includes a solenoid coil, and said marker includes a needle.

3. The marking apparatus of claim 1, in which said arm has two ends fixed to said support plate and a central portion of said arm is fixedly secured to said support plate between said two ends.

4. The marking apparatus of claim 1, in which said arm has one end fixed to said support plate and has another end fixedly secured to said actuator.

5. The marking apparatus of claim 1, in which said actuator has a solenoid coil.

6. The marking apparatus of claim 5 in which said marker has a marking off needle for scratching the surface of said defective semiconductor chip.

* * * * *